United States Patent
Mase

(10) Patent No.: US 11,284,530 B2
(45) Date of Patent: Mar. 22, 2022

(54) SUBSTRATE CONNECTING STRUCTURE

(71) Applicant: KABUSHIKI KAISHA TOYOTA JIDOSHOKKI, Kariya (JP)

(72) Inventor: Tomoyuki Mase, Kariya (JP)

(73) Assignee: KABUSHIKI KAISHA TOYOTA JIDOSHOKKI, Kariya (JP)

( * ) Notice: Subject to any disclaimer, the term of this patent is extended or adjusted under 35 U.S.C. 154(b) by 145 days.

(21) Appl. No.: 16/518,192

(22) Filed: Jul. 22, 2019

(65) Prior Publication Data

US 2020/0037461 A1 Jan. 30, 2020

(30) Foreign Application Priority Data

Jul. 25, 2018 (JP) .............................. JP2018-139505

(51) Int. Cl.
*H05K 7/06* (2006.01)
*H05K 3/42* (2006.01)
*H01L 23/498* (2006.01)

(52) U.S. Cl.
CPC .............. *H05K 7/06* (2013.01); *H05K 3/428* (2013.01); *H01L 23/49838* (2013.01); *H05K 2201/10272* (2013.01)

(58) Field of Classification Search
CPC ..... H05K 3/428; H05K 7/06; H01L 23/49838
See application file for complete search history.

(56) References Cited

U.S. PATENT DOCUMENTS

| 4,628,407 | A | * | 12/1986 | August | ................... | H01L 23/36 257/E23.101 |
| 5,581,443 | A | | 12/1996 | Nakamura et al. | | |
| 5,784,256 | A | | 7/1998 | Nakamura et al. | | |
| 9,763,317 | B2 | | 9/2017 | Mass et al. | | |
| 2011/0096495 | A1 | | 4/2011 | Heise | | |

FOREIGN PATENT DOCUMENTS

| JP | 59-016349 A | | 1/1984 |
| JP | 08-222671 A | | 8/1996 |
| JP | 2000102253 A | * | 4/2000 |
| JP | 2007-042993 A | | 2/2007 |
| JP | 2015-047031 A | | 3/2015 |
| WO | 2010047366 A1 | * | 4/2010 |

* cited by examiner

*Primary Examiner* — Carl J Arbes
(74) *Attorney, Agent, or Firm* — Sughrue Mion, PLLC

(57) ABSTRACT

A substrate connecting structure includes a substrate that includes a flat base material having a first surface and a second surface at a side opposite to the first surface, a first wiring layer arranged on the first surface, and a second wiring layer arranged on the second surface, a through hole extending through the base material, a connection metal body that includes a connecting portion connected to the second wiring layer and a projection inserted into the through hole, and a mounted component mounted on the substrate. The connection metal body is connected to the mounted component only at a distal end surface of the projection.

9 Claims, 3 Drawing Sheets

SUBSTRATE CONNECTING STRUCTURE

BACKGROUND

1. Field

The present disclosure relates to a substrate connecting structure.

2. Description of Related Art

A typical substrate includes a flat base material and two wiring layers arranged on the two surfaces of the base material. Through holes are used to electrically connect the two wiring layers. For example, Japanese Laid-Open Publication No. 2007-42993 describes that a multilayer substrate includes substrates, one of which includes a through hole. A wall surface of the base material defining the through hole is covered with plating.

In order to increase heat dissipation or the like of the substrate, a connection metal body may be inserted into the through hole, and the connection metal body may be joined with a metal bonding material such as solder to mounted components mounted on the substrate. In this case, stress generated in the metal bonding material that results from the difference between the linear expansion coefficient of the base material and the linear expansion coefficient of the connection metal body should be reduced.

SUMMARY

It is an objective of the present disclosure to provide a substrate connecting structure that reduces stress generated in a joining portion where a mounted component mounted on a substrate is joined with a connection metal body.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A first general aspect of the present disclosure provides a substrate connecting structure, including a substrate that includes a flat base material having a first surface and a second surface at a side opposite to the first surface, a first resist and a first wiring layer arranged on the first surface, and a second resist and a second wiring layer arranged on the second surface, a through hole extending through the base material, a connection metal body that includes a connecting portion connected to the second wiring layer and a projection inserted into the through hole, and a mounted component mounted on the substrate. The substrate, the connection metal body, and the mounted component are electrically connected to one another, the mounted component and the connection metal body are joined by a first joining portion formed from a metal bonding material, the first wiring layer is covered by the first resist at a periphery of the through hole, the connection metal body is connected to the mounted component only at a distal end surface of the projection, the second resist includes a boundary portion that exposes a wiring layer connecting portion of the second wiring layer at a periphery of the through hole, the wiring layer connecting portion being connected to the connecting portion, and the connecting portion and the wiring layer connecting portion are joined by a second joining portion formed from a metal bonding material.

Another general aspect of the present disclosure provides a substrate connecting structure, including a substrate that includes a base material having a first surface and a second surface at a side opposite to the first surface, a first wiring layer arranged on the first surface, and a second wiring layer arranged on the second surface, the base material including a wall surface that defines a through hole extending through the base material, a connection metal body that includes a connecting portion and a projection inserted into the through hole, a mounted component mounted on the substrate, a first joining portion that electrically connects the mounted component and the connection metal body, and a second joining portion that electrically connects the connecting portion and the second wiring layer. A clearance is provided between the wall surface and the projection.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

This description provides a comprehensive understanding of the methods, apparatuses, and/or systems described. Modifications and equivalents of the methods, apparatuses, and/or systems described are apparent to one of ordinary skill in the art. Sequences of operations are exemplary, and may be changed as apparent to one of ordinary skill in the art, with the exception of operations necessarily occurring in a certain order. Descriptions of functions and constructions that are well known to one of ordinary skill in the art may be omitted.

Exemplary embodiments may have different forms, and are not limited to the examples described. However, the examples described are thorough and complete, and convey the full scope of the disclosure to one of ordinary skill in the art.

One embodiment of a substrate connecting structure will now be described.

Figure 1:
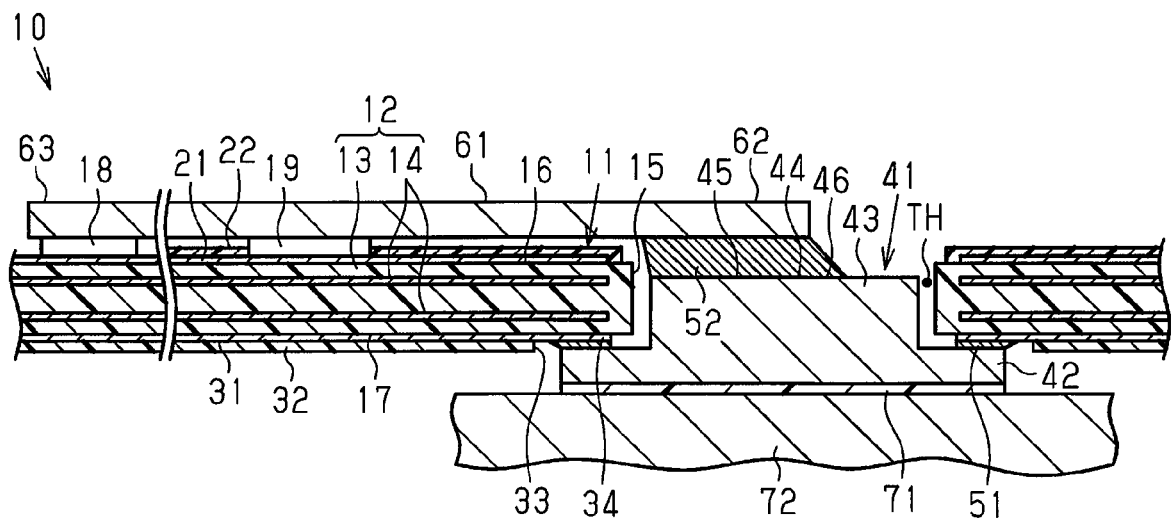
FIG. 1 is a cross-sectional view of a substrate connecting structure.
Figure 2:
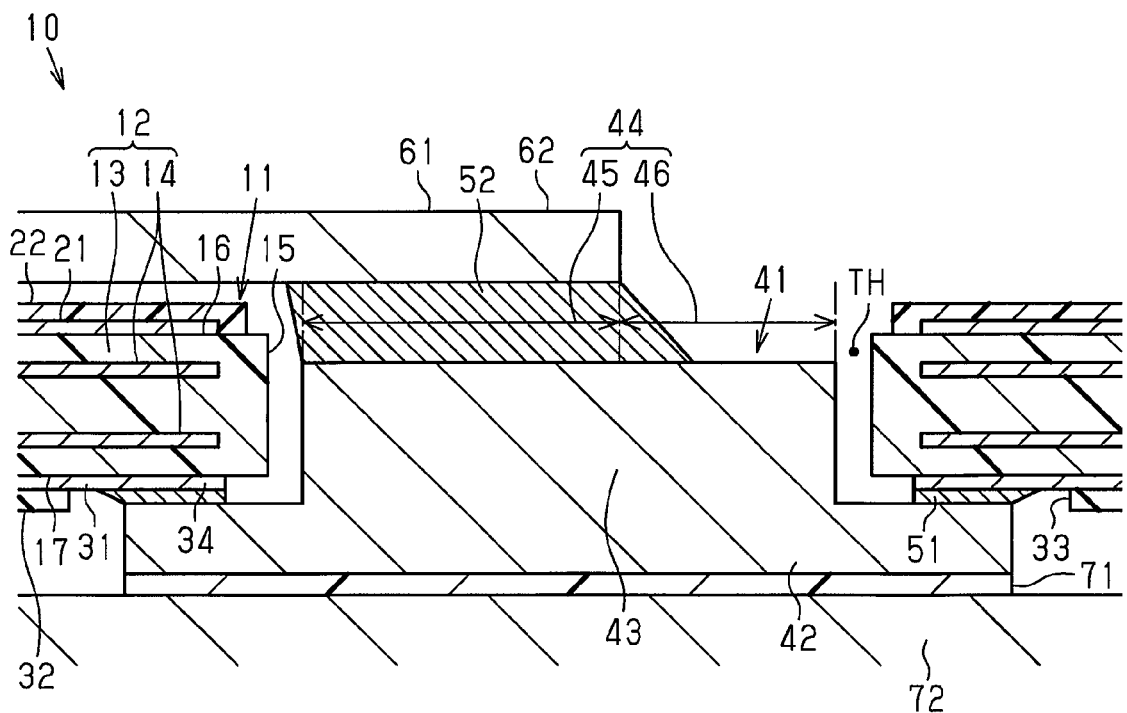
FIG. 2 is an enlarged cross-sectional view of the substrate connecting structure in FIG. 1.

As shown in FIGS. 1 and 2, a substrate connecting structure 10 includes a substrate 11, a bus bar 61, which serves as a mounted component mounted on the substrate 11, and a connection metal body 41. The substrate connecting structure 10 serves as a structure that electrically connects the substrate 11, the bus bar 61, and the connection metal body 41. The connection metal body 41 and the bus bar 61 are joined by a first joining portion 52, and the connection metal body 41 and the substrate 11 are joined by a second joining portion 51.

The substrate 11 includes a flat base material 12, a first wiring layer 21 and a second wiring layer 31 arranged on the two surfaces of the base material 12, a first resist 22 and a second resist 32 arranged on the two surfaces of the base material 12, and two lands 18, 19 arranged on the base material 12.

The base material 12 includes an insulating layer 13, which is made of an insulating material, and an internal wiring layer 14, which is arranged inside the insulating layer 13 and made of gold. The base material 12 includes a wall surface 15 that defines a through hole TH extending through the base material 12. In the present embodiment, the wall surface 15 and the through hole TH defined by the wall surface 15 are circular. The wall surface 15 is an exposed surface of the insulating layer 13. The first resist 22, the second resist 32, the first wiring layer 21, and the second wiring layer 31 are not arranged on the entire wall surface 15. In other words, the wall surface 15 is exposed to the outside in the through hole TH.

One surface of the base material 12 in the thickness-wise direction is referred to as a first surface 16, and a surface at a side of the base material 12 opposite to the first surface 16 is referred to as a second surface 17. The first wiring layer 21 is covered with the first resist 22 arranged on the first surface 16 at a periphery of the through hole TH. That is, the first resist 22 covers the portion of the first wiring layer 21 that is closest to the through hole TH. The first wiring layer 21 is not exposed to the outside at a periphery of the through hole TH. The land 19 is arranged on the first surface 16. The land 19 is separated from the through hole TH. The first resist 22 is located between the land 19 and the through hole TH.

Figure 3:
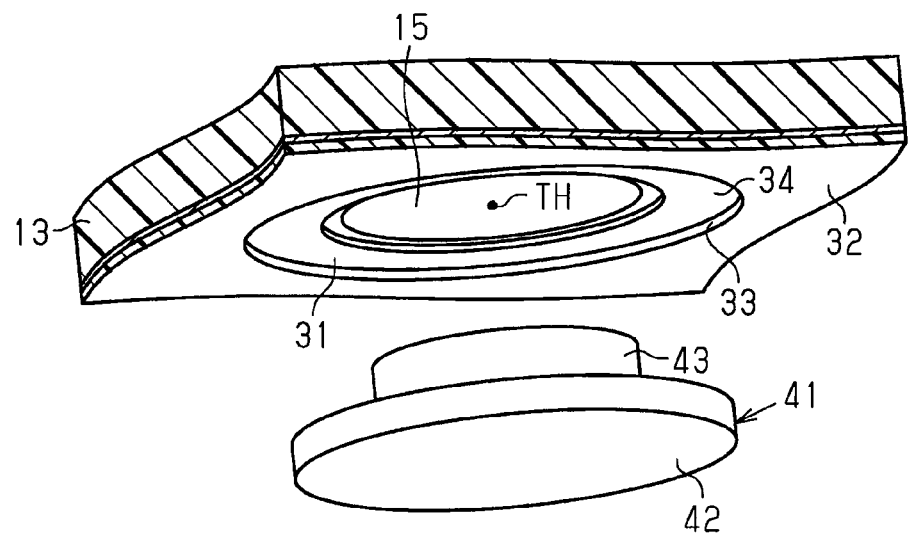
FIG. 3 is a perspective view showing a substrate and a connection metal body.

As shown in FIGS. 2 and 3, the second wiring layer 31 arranged on the second surface 17 is exposed from the second resist 32 arranged on the second surface 17 at a periphery of the through hole TH. That is, the second resist 32 does not cover the portion of the second wiring layer 31 that is closest to the through hole TH. In other words, the portion of the second wiring layer 31 that is closest to the through hole TH is exposed to the outside. That is, the second wiring layer 31 is partially covered with the second resist 32. More specifically, the second resist 32 includes an annular boundary portion 33. The second resist 32 is not arranged at the inner side of the boundary portion 33. The boundary portion 33 serves as the boundary between the second resist 32 and the area where the second resist 32 is not arranged. The inner diameter of the boundary portion 33 is larger than the inner diameter of the through hole TH. The boundary portion 33 is arranged concentrically with the through hole TH. The second resist 32 is not arranged between the circumferential edge of the through hole TH and the boundary portion 33. This exposes the second wiring layer 31 to the outside. A portion of the second wiring layer 31 that is exposed inside the boundary portion 33 defines a wiring layer connecting portion 34 to which the connection metal body 41 is connected. The wiring layer connecting portion 34 is annular.

Figure 4:
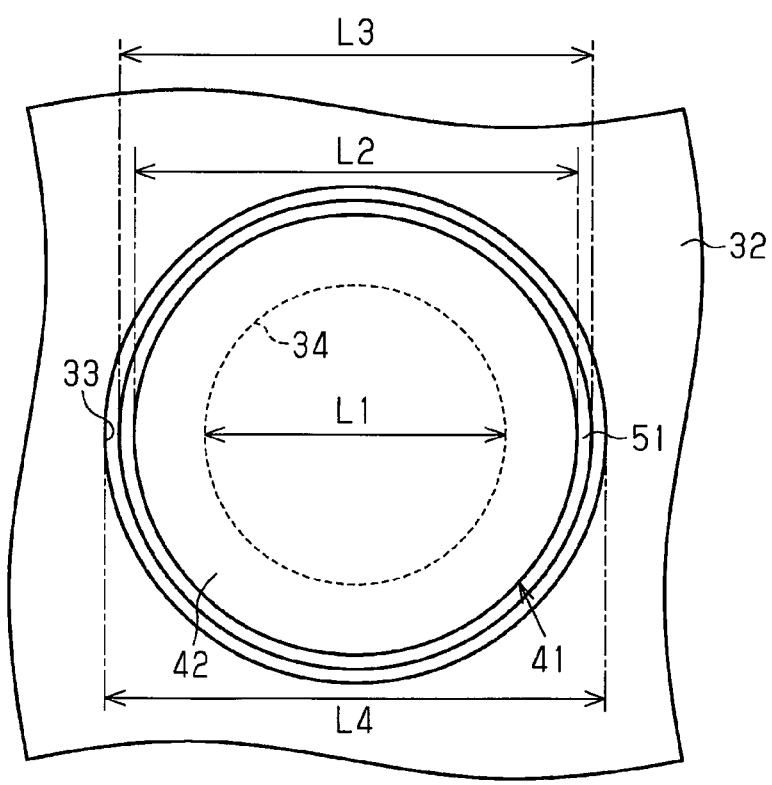
FIG. 4 is a plan view showing the substrate connecting structure of FIG. 1 from a second surface side of a base material.

As shown in FIGS. 3 and 4, the connection metal body 41 includes a disc-shaped connecting portion 42 and a cylindrical projection 43 that projects from the connecting portion 42. The connection metal body 41 in the present embodiment is made of copper. The projection 43 projects from the center of the connecting portion 42. The outer diameter of the projection 43 is smaller than the inner diameter of the through hole TH. Outer diameter L2 of the connecting portion 42 is larger than the inner diameter of the through hole TH. Outer diameter L2 of the connecting portion 42 is larger than inner diameter L1 of the wiring layer connecting portion 34 and smaller than inner diameter L4 of the boundary portion 33.

As shown in FIG. 2, the projection 43 of the connection metal body 41 is inserted into the through hole TH. The connection metal body 41 is arranged so that the projection 43 and the through hole TH are concentric. The connecting portion 42 of the connection metal body 41 is joined with the wiring layer connecting portion 34 by the second joining portion 51, which is formed from a metal bonding material. The metal bonding material includes, for example, a brazing filler metal used to join metals. In the present embodiment, solder is used as the metal bonding material. The second joining portion 51 is located between the connecting portion 42 and the wiring layer connecting portion 34.

As shown in FIG. 4, the second joining portion 51 is annular. Outer diameter L3 of the second joining portion 51 is larger than outer diameter L2 of the connecting portion 42 and smaller than inner diameter L4 of the boundary portion 33. The second joining portion 51 includes a first portion located between the connecting portion 42 and the wiring layer connecting portion 34 and a second portion projecting from the first portion toward the boundary portion 33. The second portion serves as a fillet.

Referring to FIG. 1, the bus bar 61 is a rectangular flat copper plate. The bus bar 61 has a width that is larger in dimension than the inner diameter of the through hole TH. The bus bar 61 has a first longitudinal end 62 and a second longitudinal end 63. The first longitudinal end 62 overlaps a distal end surface 44 of the projection 43 in a projection direction of the projection 43, which projects from the connecting portion 42. The second longitudinal end 63 is connected to the land 18.

As shown in FIG. 2, the distal end surface 44 of the projection 43 includes a covered region 45 that is overlapped with the bus bar 61 and a non-covered region 46 that is not overlapped with the bus bar 61. The bus bar 61 overlaps the land 19. The land 19 serves as a positioning land used to position the bus bar 61 when joining the bus bar 61 with the connection metal body 41.

The distal end surface 44 of the projection 43 is joined with the bus bar 61 by the first joining portion 52 that is formed from a metal bonding material. The first joining portion 52 joins the bus bar 61, which serves as a mounted component that is mounted on the substrate 11, and the connection metal body 41. The metal bonding material includes, for example, a brazing filler metal used to join metals. In the present embodiment, solder is used as the metal bonding material that forms the first joining portion 52. The first joining portion 52 is located between the distal end surface 44 of the projection 43 and the bus bar 61. The first joining portion 52 includes a fillet formed on the non-covered region 46.

The connection metal body 41 is connected to the bus bar 61 only at the distal end surface 44 of the projection 43. That is, only the distal end surface 44 is directly connected to the first joining portion 52. In other words, in the substrate connecting structure 10 of the present embodiment, metal bonding material is not arranged between the wall surface 15, which defines the through hole TH, and the circumferential surface of the projection 43. Open space extends between the wall surface 15, which defines the through hole TH, and the projection 43. In other words, a clearance is provided between the wall surface 15 and the projection 43.

The substrate connecting structure 10 includes an insulator 71 and a metal base plate 72. The base plate 72 is fixed to the connecting portion 42 of the connection metal body 41 by the insulator 71. The insulator 71 may be omitted if the base plate 72 is insulative.

As current flows to the substrate connecting structure 10, heat is generated at portions where the current flows through such as the bus bar 61, the first wiring layer 21, the second wiring layer 31, the connection metal body 41, the second joining portion 51, and the first joining portion 52. The generated heat is transferred to the base plate 72 via the connection metal body 41. The connection metal body 41 serves as a current passage through which current flows and a heat transfer passage through which heat is transferred to the base plate 72.

The operation of the embodiment will now be described. A substrate connecting structure in a comparative example will be described first. In the substrate connecting structure of the comparative example, same reference numerals are given to those components that are the same as the corresponding components of the embodiment.

Figure 5:
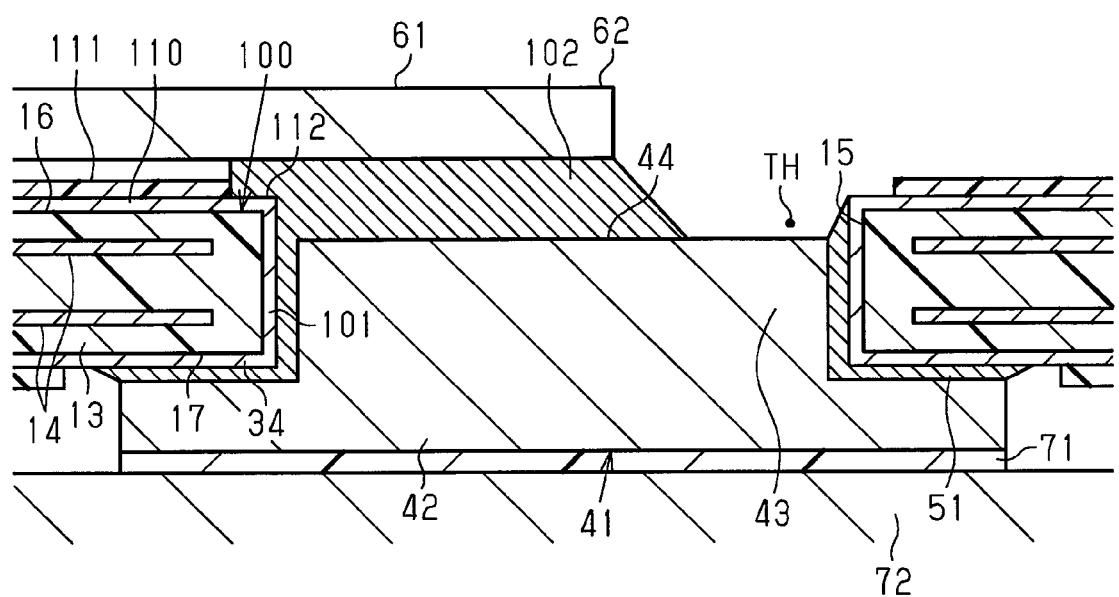
FIG. 5 is a cross-sectional view of a substrate connecting structure in a comparative example.

As shown in FIG. 5, the substrate connecting structure in the comparative example includes a metal land 101 extending over the entire circumference of the wall surface 15 of a base material 100. In this case, a joining portion 102 that joins the connection metal body 41 and the bus bar 61 is located between the land 101 and the circumferential surface of the projection 43 in addition to between the distal end surface 44 of the projection 43 and the bus bar 61. Further, a first wiring layer 110 includes an exposed portion 112 that is exposed from a first resist 111 at a periphery of the through hole TH. The bus bar 61 and the exposed portion 112 are joined by the joining portion 102 at a periphery of the through hole TH. The exposed portion 112 exposed from the first resist 111 is a land that positions the bus bar 61.

The heat generated as current flows expands the connection metal body 41 and the base material 100. The amount of expansion of the connection metal body 41 differs from the amount of expansion of the base material 100. This results from the difference between the linear expansion coefficient of the connection metal body 41 and the linear expansion coefficient of the base material 100. Thus, stress is generated at the joining portion 102 between the land 101 and the circumferential surface of the projection 43. If expansion and contraction are repeated by heating and cooling, the joining portion 102 may crack. Cracks in the joining portion 102 between the land 101 and the circumferential surface of the projection 43 may spread to the joining portion 102 between the bus bar 61 and the distal end surface 44 of the projection 43.

In contrast, the substrate connecting structure 10 of the present embodiment does not include a land on the wall surface 15. When joining the connection metal body 41 and the bus bar 61, solder is arranged between the distal end surface 44 and the bus bar 61, and the substrate connecting structure 10 is heated in a furnace. The insulating layer 13 is a surface exposed from the wall surface 15, and molten solder does not adhere to the wall surface 15. Thus, the molten solder does not spread between the wall surface 15 and the circumferential surface of the projection 43. After the solder is melted, the substrate connecting structure 10 is cooled to harden the solder and thereby form the first joining portion 52.

The joining state of the connection metal body 41 and the bus bar 61 is inspected after the solder is hardened. The distal end surface 44 of the projection 43 includes the non-covered region 46. This allows for easy visual inspection of the interface between the distal end surface 44 and the first joining portion 52 and the interface between the bus bar 61 and the first joining portion 52. Further, the fillet of the first joining portion 52 is formed on the non-covered region 46. This allows for easy determination of whether the joining state is satisfactory.

As described above, the substrate connecting structure 10 in the present embodiment does not include the first joining portion 52 between the wall surface 15 and the circumferential surface of the projection 43. Even if the amount of expansion of the connection metal body 41 differs from the amount of expansion of the base material 12, stress caused by the difference in the amount of expansion will be limited in the first joining portion 52 because the first joining portion 52 does not include a portion that is in contact with the wall surface 15 or the circumferential surface of the projection 43. Stress generated in the first joining portion 52 is reduced in comparison with the substrate connecting structure of the comparative example.

Further, the first wiring layer 21 is covered with the first resist 22 at a periphery of the through hole TH so that the first joining portion 52 is not arranged between the first wiring layer 21 and the bus bar 61. Even though the first joining portion 52 is not located between the wall surface 15 and the circumferential surface of the projection 43, if the first wiring layer 21 and the bus bar 61 are joined by the first joining portion 52 at a periphery of the through hole TH, stress may be generated at the first joining portion 52 that joins the first wiring layer 21 and the bus bar 61. However, the positioning land 19 is spaced apart from the through hole TH in the present embodiment. This reduces stress generated at the first joining portion 52.

The substrate connecting structure 10 in the present embodiment does not include the first joining portion 52 between the wall surface 15 and the circumferential surface of the projection 43. Thus, the substrate connecting structure 10 in the present embodiment has a smaller current passage and a smaller heat transfer passage in the through hole TH than the substrate connecting structure in the comparative example. However, the connection metal body 41 made of copper has higher electric conductivity and thermal conductivity than solder. Thus, the elimination of solder from between the wall surface 15 and the circumferential surface of the projection 43 has little influence on the conductivity and heat dissipation.

The advantages of the embodiment will now be described.

(1) The first joining portion 52 is not located between the circumferential surface of the projection 43 and the wall surface 15 that defines the through hole TH. Even when the connection metal body 41 and the base material 12 expand, stress is limited that would be generated at the first joining portion 52 by the difference between the linear expansion coefficient of the connection metal body 41 and the linear expansion coefficient of the base material 12. This reduces damage such as cracking of the first joining portion 52 and prolongs the life of the substrate connecting structure 10.

(2) The connecting portion 42 is disc-shaped, the boundary portion 33 is annular, and the second joining portion 51 is annular. The entire circumference of the connecting portion 42 is joined with the annular wiring layer connecting portion 34 so that the contact area between the second wiring layer 31 and the connection metal body 41 is increased as compared with when the connecting portion 42 is partially joined with the wiring layer connecting portion 34 in the circumferential direction. This increases the bonding strength between the connection metal body 41 and the second wiring layer 31 and reduces the resistance value of the interface between the connection metal body 41 and the second wiring layer 31.

(3) The distal end surface 44 includes the non-covered region 46 that does not overlap the bus bar 61. This allows for easy visual inspection of the first joining portion 52 between the distal end surface 44 of the projection 43 and the bus bar 61 and easy inspection of the joining state.

The embodiment may be modified as described below. The embodiment and modifications below may be implemented in combination as long as there are no technical contradictions.

The mounted component may be a component such as a semiconductor device connected to the connection metal body 41 by the first joining portion 52.

The distal end surface 44 of the projection 43 may be entirely overlapped with the bus bar 61.

The connecting portion 42 of the connection metal body 41 does not need to be disc-shaped. The connecting portion 42 may be quadrangular and flat. Further, the connecting portion 42 does not need to extend from the projection 43 over the entire circumferential direction of the projection 43 and may extend from part of the projection 43 in the circumferential direction.

The boundary portion 33 does not need to be annular. In this case, the shapes of the connecting portion 42 of the connection metal body 41 and the second joining portion 51 may be changed in accordance with the shape of the boundary portion 33.

Outer diameter L3 of the second joining portion 51 may be smaller than outer diameter L2 of the connecting portion 42.

The base material 12 does not need to include the internal wiring layer 14.

The metal bonding material that forms the first joining portion 52 and the metal bonding material that forms the second joining portion 51 may be a brazing filler metal such as silver paste instead of solder.

The connection metal body 41 may be made of a metal other than copper.

The second longitudinal end 63 of the bus bar 61 may be connected to the first wiring layer 21.

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

What is claimed is:

1. A substrate connecting structure, comprising:
   a substrate that includes a flat base material having a first surface and a second surface at a side opposite to the first surface, a first resist and a first wiring layer arranged on the first surface, and a second resist and a second wiring layer arranged on the second surface, wherein a through hole extends through the base material;
   a connection metal body that includes a connecting portion connected to the second wiring layer and a projection inserted into the through hole; and
   a mounted component mounted on the substrate, wherein the substrate, the connection metal body, and the mounted component are electrically connected to one another,
   the mounted component and the connection metal body are joined by a first joining portion formed from a metal bonding material,
   the first wiring layer is covered by the first resist at a periphery of the through hole,
   the connection metal body is connected to the mounted component only at a distal end surface of the projection,
   the second resist includes a boundary portion that exposes a wiring layer connecting portion of the second wiring layer at a periphery of the through hole, the wiring layer connecting portion being connected to the connecting portion, and
   the connecting portion and the wiring layer connecting portion are joined by a second joining portion formed from a metal bonding material.

2. The substrate connecting structure according to claim 1, wherein
   the connecting portion is disc-shaped,
   the boundary portion is annular,
   the wiring layer connecting portion is annular,
   an outer diameter of the connecting portion is larger than an inner diameter of the wiring layer connecting portion and smaller than an inner diameter of the boundary portion, and
   an outer diameter of the second joining portion is larger than the outer diameter of the connecting portion and smaller than the inner diameter of the boundary portion.

3. The substrate connecting structure according to claim 1, wherein the distal end surface of the projection includes a non-covered region that does not overlap the mounted component.

4. The substrate connecting structure according to claim 1, wherein the mounted component is a bus bar.

5. A substrate connecting structure, comprising:
   a substrate that includes a base material having a first surface and a second surface at a side opposite to the first surface, a first wiring layer arranged on the first surface, and a second wiring layer arranged on the second surface, wherein the base material includes a wall surface that defines a through hole extending through the base material;
   a connection metal body that includes a connecting portion and a projection inserted into the through hole;
   a mounted component mounted on the substrate;
   a first joining portion that electrically connects the mounted component and the connection metal body; and
   a second joining portion that electrically connects the connecting portion and the second wiring layer,
   wherein a clearance is provided between the wall surface and the projection.

6. The substrate connecting structure according to claim 5, wherein the projection includes a distal end surface, and only the distal end surface is directly connected to the first joining portion.

7. The substrate connecting structure according to claim 5, wherein the clearance is provided between the wall surface and an entire circumferential surface of the projection.

8. The substrate connecting structure according to claim 5, wherein the substrate includes a first resist that covers the first wiring layer at a periphery of the through hole and a second resist that partially covers the second wiring layer, the second wiring layer includes a wiring layer connecting portion connected to the connecting portion, and the wiring layer connecting portion is not covered by the second resist.

9. The substrate connecting structure according to claim 8, wherein the first resist covers a portion of the first wiring layer that is closest to the through hole.

* * * * *